US006987683B2

(12) United States Patent
Ao

(10) Patent No.: US 6,987,683 B2
(45) Date of Patent: Jan. 17, 2006

(54) MAGNITUDE COMPARATOR BASED CONTENT ADDRESSABLE MEMORY FOR SEARCH AND SORTING

(75) Inventor: Hai Ao, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 247 days.

(21) Appl. No.: 10/440,131

(22) Filed: May 19, 2003

(65) Prior Publication Data

US 2004/0233692 A1 Nov. 25, 2004

(51) Int. Cl.
*G11C 15/00* (2006.01)
(52) U.S. Cl. ............... 365/49; 365/189.07; 365/189.08
(58) Field of Classification Search ................. 365/49, 365/189.07, 189.08; 711/108, 201; 713/201
See application file for complete search history.

(56) References Cited

U.S. PATENT DOCUMENTS

| 5,448,713 | A | | 9/1995 | Hamamoto |
| 5,835,928 | A | | 11/1998 | Auslander et al. |
| 5,999,435 | A | * | 12/1999 | Henderson et al. ........... 365/49 |
| 6,381,673 | B1 | * | 4/2002 | Srinivasan et al. ......... 711/108 |
| 6,389,507 | B1 | | 5/2002 | Sherman |
| 6,473,846 | B1 | | 10/2002 | Melchior |
| 6,633,953 | B2 | * | 10/2003 | Stark ........................... 711/108 |
| 6,715,084 | B2 | * | 3/2004 | Aaron et al. ................. 713/201 |
| 6,744,654 | B2 | * | 6/2004 | Loughmiller ................. 365/49 |
| 2002/0152209 | A1 | | 10/2002 | Merugu et al. |

OTHER PUBLICATIONS

Grosspietsch, Karl E., Associative Processors and Memories: A Survey, IEEE Micro, Jun. 1992., pp. 12-19.

Chisvin, Lawrence and Duckworth, James R., Content-Addressable and Associative Memory: Alternatives to the Ubiquitous RAM, IEEE, Jul. 1989, pp. 51-64.
Sharma, Samar and Panigrahy, Rina, Sorting and Searching Using Ternary CAMs, IEEE, Proceedings of the 10th Symposium on High Performance Interconnects Hot Interconnects, May 2002.
Djemal, Ridha, Mazare, Guy and Michel, Gerard, Toward Reconfigurable Associative Architecture for High Speed Communication Operators, IEEE, Proceedings of the IEEE Symposium and Workshop on Engineering of Computer Based Systems, Sep. 1996, pp. 74-79.
Panigrahy, Rina and Sharma, Samar, Reducing TCAM Power Consumption and Increasing Throughput, IEEE, Proceedings of the 10th Symposium on High Performance Interconnects Hot Interconnects, May 2002.
Liu, Huan, Routing Table Compaction in Ternary CAM, IEEE, Jan.-Feb. 2002, pp. 58-64.
Liu, Huan, Efficient Mapping of Range Classifier into Ternary-CAM, IEEE, Proceedings of the 10th Symposium on High Performance Interconnects Hot Interconnects, May, 2002.

* cited by examiner

*Primary Examiner*—Son T. Dinh
(74) *Attorney, Agent, or Firm*—Dickstein Shapiro Morin & Oshinsky LLP

(57) ABSTRACT

A content addressable memory (CAM), system, processing system, router and method of operating the same is provided. A CAM array includes more than one CAM cell with a comparison circuit and a content data storage. A priority encoder logic structure is connected with the CAM array and determines if physically or logically adjacent CAM cells have outputs such that an upper and lower content range is determined.

60 Claims, 8 Drawing Sheets

| CAM Cell | Comparison Circuit Operation and Values | Boundary Values | CAM Cell Output Lines | CAM Cell Output | Priority Encoder AND Gate Input | Result |
|---|---|---|---|---|---|---|
| Cell 205 | 12 < 9 = N | 9 | 243 | 0 | 1 | 1 = True |
| Cell 207 | 12 < 767 = Y | 767 | 245 | 1 | 1 | |
| | | 767 | 249 | 1 | 0 | 0 = False |
| Cell 209 | 12 < 1430 = Y | 1430 | 251 | 1 | 1 | |
| | | 1430 | 255 | 1 | 0 | 0 = False |
| Cell 211 | 12 < 1440 = Y | 1440 | 257 | 1 | 1 | |
| | | 1430 | 261 | 1 | 0 | 0 = False |
| Cell 213 | 12 < 3201 = Y | 3201 | 263 | 1 | 1 | |
| | | 3201 | 267 | 1 | 0 | 0 = False |
| Cell 215 | 12 < 3333 = Y | 3333 | 269 | 1 | 1 | |

FIG. 5

MAGNITUDE COMPARATOR BASED CONTENT ADDRESSABLE MEMORY FOR SEARCH AND SORTING

FIELD OF THE INVENTION

The present invention relates generally to semiconductor memory, and more particularly to a content addressable memory (CAM).

BACKGROUND OF THE INVENTION

A content addressable memory CAM device is a static storage device constructed of modified random access memory (RAM) cells. A CAM accelerates any application requiring fast searches of e.g., a database, list, or pattern, such as in database systems, image or voice recognition systems, or computer and communication networks. CAMs provide benefits over other memory search algorithms by simultaneously comparing input or selected information (i.e., data in the comparant register) against a list of pre-stored entries in the CAM memory element or array. As a result of their unique searching scheme, CAM devices are frequently employed in network equipment, particularly routers, gateways and switches, computer systems and other devices that require rapid content searching, such as routing tables for data networks or matching Internet Universal Resource Locators (URLs). Some of these tables are "learned" from the data passing through the network. Other tables are fixed tables that are loaded into the CAM by a system controller. These fixed tables reside in the CAM for a relatively long period of time. A word in a CAM is typically very large and can be 96 bits or more.

CAMs are organized differently than other memory devices (e.g., dynamic random access memory (DRAM) and static random access memory (SRAM)) in order to perform a parallel content memory search. For example, data is stored in a RAM at a particular physical location on the RAM chip, called a memory address. During a conventional RAM memory access, a user or an application supplies a memory address and data is read into or written out of the specified address. A CAM performs addressing using the content of the data rather than supplying a memory location to address stored data.

In a CAM, data is stored in locations in a somewhat random fashion. CAM storage locations can be selected by an address bus or the data can be written into the first empty memory location. Every location has one or a pair of status bits that keep track of whether the location is storing valid information in it or is empty and available for writing.

Once information is stored in a memory location, it is found in a conventional CAM device by comparing every bit in memory with data in the comparant register. When the content stored in the CAM memory location does not match the data in the comparant register, the local match detection circuit returns a no match indication. When the content stored in the CAM memory location matches the data in the comparant register, the local match detection circuit returns a match. If one or more local match detect circuits return a match, the CAM device returns a "match" indication. Otherwise, the CAM device returns a "no-match" indication. When the device is capable of returning a "match" or "no-match" indication, the device is known as a binary CAM. A CAM device with "match" "no-match" and "don't care" output is known as a ternary CAM. In addition, the CAM may return the identification of the address location in which the desired data is stored. Thus, with a CAM, the user supplies the data and gets back an address if there a match is found in the CAM memory.

Data search and table look-up performance has been improved by the introduction and development of binary and ternary CAM devices. Conventional CAM devices, however, have neither the power or space efficiency required to retrieve data by magnitude ranges. Magnitude range refers to a set of numerical values such as the numerical range of 10 to 50.

Conventional systems require a range determination using multiple comparators then a separate processing cycle to perform table look-ups to determine what action was required based on the determined range. Also, multiple processing cycles are needed in many cases to determine range data and look up actions corresponding to a range data. Also, convention systems require complicated and costly comparator designs which suffered from a variety of shortcomings. Efforts to address this shortcoming via bit masking, modification of equality comparator based CAM cells or other approaches have not been successful in improving magnitude range data retrieval, range matching and range sorting. Accordingly, there exists a need to provide improved range matching, range sorting and range based retrieval using magnitude ranges.

BRIEF SUMMARY OF THE INVENTION

The present invention provides a CAM array constructed with a comparison circuit within all or a series of CAM cells within the array. A user ordered set of comparison data is stored in CAM word registers. The comparison circuits are set to perform a selected one of different comparison operations. Comparisons are accomplished between data stored in CAM word registers and a comparant register in parallel by the comparison circuit. Each CAM cell outputs a comparison result to a priority encoder.

Comparison outputs between at least two CAM cells are detected by the priority encoder, thereby determining an upper and lower magnitude range. In one embodiment, the priority encoder determines if adjacent CAM cells indicate that comparant value is in proximity to a value stored in the CAM cell words. The numerical values stored in the two adjacent CAM cell words with a desired output represent upper and lower magnitude range values for a given input from the comparant register. Logical proximity schemes can also be incorporated into the priority encoder for detecting relationships between CAM cell outputs that are not physically adjacent.

Various exemplary embodiments and methods of their operation are discussed in detail below. These and other features of the invention are described in more detail below in connection with the accompanying drawings.

BRIEF DESCRIPTION OF THE DRAWINGS

FIG. 5 shows a representation of the FIG. 4 exemplary embodiment with one set of example comparison operations, boundary values, CAM cell outputs, priority encoder inputs and results;

DETAILED DESCRIPTION OF THE INVENTION

Magnitude comparator CAM devices are superior to conventional equality based CAM devices in a variety of applications. For example, a magnitude based CAM system can more efficiently perform search and sort operations using range matching where a search key falls into a range, rather than being matched to a specific value as in equality matching. A magnitude comparator CAM device can also perform mixed exact match and magnitude searches. Applications for the magnitude comparator CAM devices include network port access control, firewall operations, L2–L7 access control (e.g., port based or range access), L2–L4 interface port based firewall applications, L3 class full and classless CIDR routing, IP multicast group association, IPsec and virtual private network (VPN) operations (e.g., crypto access lists used to define crypto protected and non crypto protected traffic), traffic conditioning blocks (e.g., rate based flow management), hardware based sorting/allocation engines, real time industrial automatic control/fuzzy/embedded systems and aerospace/military applications.

Figure 1:
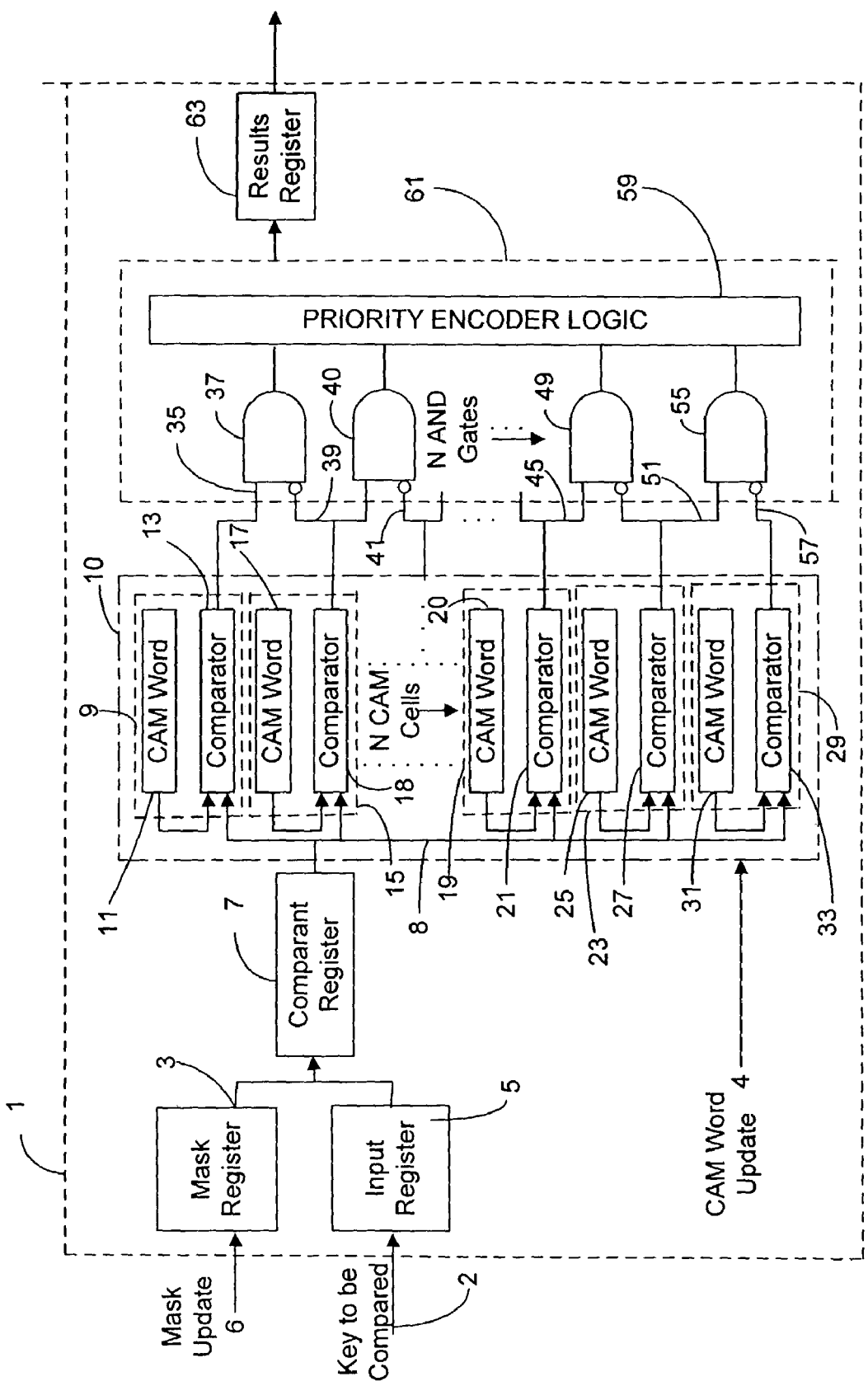
FIG. 1 shows a CAM system constructed in accordance with an exemplary embodiment of the invention.

Referring to FIG. 1, an exemplary embodiment of a CAM system 1 in accordance with the invention is shown. An input key 2 to be compared is stored in an input register 5. A mask register 3 is coupled with the input register 5 to cooperatively store a masked input key in the comparant register 7. The mask register 3 is updated by a user to limit processing of the input key 2 to certain bits of the incoming input key 2. A masked input key is stored in the comparant register 7. It should be appreciated that the function of the invention can be performed with or without the mask data. A series of CAM cells 9, 15, 19, 23, 29 are provided in a CAM array 10 and coupled with the comparant register 7 by a bus 8 to permit parallel comparison of the masked input key with values stored in the CAM cells. Each CAM cell 9, 15, 19, 23, 29 contains a CAM word register 11, 17, 20, 25, 31 and a comparator circuit 13, 18, 21, 27, 33 respectively. The comparator circuit (e.g., circuit 13) in each CAM cell (e.g., cell 9) compares the masked input key from the comparant register 7 with a value stored in its associated CAM word register (e.g., word register 11) within the same CAM cell (e.g., cell 9). Each CAM word (e.g., word 11) stores a content data, mask data and configuration data. Each comparator circuit performs a comparison based on configuration data. The configuration data, mask data and content data values are updated as desired by a user. Alternatively, a computer system can update configuration, mask or content data as needed such as is found in adaptive network routers. The configuration data determines what operation will be performed by the comparator circuit (e.g., circuit 13) such as greater-than, less-than or equal-to. The configuration data can be stored outside of a CAM word (e.g., CAM word 11) or CAM cell as well.

A magnitude comparator based CAM in accordance with an exemplary embodiment of the invention can be efficiently implemented on a memory chip in hardware. The chip may contain a number of comparator based CAM cells, which may or may not be configurable to perform one or more of three magnitude comparison functions (i.e., greater-than, equal-to or less-than) independently. Magnitude comparator based CAMs of the invention can support all the features that equality matching based CAM devices provide. A magnitude comparator CAM cell of the invention can be composed of magnitude comparators which are capable of producing a greater-than (>), equal-to (=) or less-than (<) comparison, or any combination of the three comparisons as contrasted to a conventional CAM cell which only includes a matching cell function with or without bit masking.

A CAM apparatus in accordance with one embodiment the invention stores a set of ordered comparison data in a series of CAM word memory cells. A CAM array includes a comparant register and an array of CAM cells. The CAM cells include a comparison circuit set to perform a comparison operation and a comparison data register (also called a CAM word). Each comparison data represents a value that defines a point in a range within which the comparant data representation can be found.

Ordered comparison data is stored in a series of CAM cells, each data value representing N number of points in a set of values that the comparant value may assume. For example, comparant data may include any four values in the range from "1" through "20". Comparison data can include any value which falls within the range beginning with "1" and ending with "20". Comparison data is selected for storage within CAM word cells based on operational factors such as actions taken when a value falls within a first, second, third, etc range.

Logic structures in a priority encoder respectively receive outputs from comparator circuits in the CAM cells. The priority encoder determines which one of the CAM cells contain comparison data which represents an upper range boundary and which one of the CAM cells contains comparison data which represents a lower range boundary for a given comparant data.

Extending further the above simplified example, a set of CAM words within four CAM cells for a four-bit CAM device can store the values of "2", "9", "10" and "14". An ordered sequence of comparison data might be N number of Internet Protocol (IP) addresses. A lowest value IP address is stored in a CAM cell at one end of the CAM array, then the next higher IP address is stored in the next CAM cell, and so on until the highest value IP address of interest is stored in the CAM cell at the other end of the array of CAM cells. After loading of the CAM cells is complete, then a comparison condition operator associated with each CAM cell can be set or left in a default state. The comparison condition operator can include a less-than or greater-than operation. An equal-to operation may also be incorporated into a CAM cell comparison circuit if so desired. An equal-to condition may also be used with magnitude range processing schemes which require indication of when a particular value is found. A group of CAM cells performs a comparison using a predetermined configuration condition operator thereby determining if the operator condition is true or false and outputting a one or a zero (or a high or a low output). A priority encoder is coupled to the CAM cells such that an AND gate with an inverted input is coupled to each set of adjacent CAM cells. The priority decoder will determine which set of two CAM cells stores data that is closest to the data stored in the comparant register. In other words, the data stored in the CAM words can be viewed as range boundaries. The priority encoder can determine which of the boundary data is closest to the comparant data. Thus, it can be determined which two CAM cells store the closest high and low range boundary data. The priority encoder will output an address to the results register of the CAM cell with the highest boundary data, the lowest boundary data or both, if desired. It is possible for the priority encoder to also evaluate whether an "equal-to" condition exists.

Once a comparison of the CAM words with the data within the comparant register 7 data has been performed, each CAM cell 9, 15, 19, 23, 29 outputs a comparison result, for example a "1" for true or "0" for false, through bit lines 35, 39, 41, 45, 51, 57 to a priority encoder 61. The priority encoder 61 includes a collection of logic cells for performing priority determination processing based on relationships between content data stored in the CAM cells and comparant data.

The illustrated exemplary priority encoder 61 includes AND gates (e.g., AND gate 37) coupled to adjacent CAM cells (e.g., cell, 19) as follows. An AND gate 37 is coupled to CAM cells 9, 15. AND gate 40 is coupled to CAM cells 15, N (not shown). AND gate 49 is coupled to adjacent CAM cells 19, 23. AND gate 55 is coupled to adjacent CAM cells 23, 29. Each AND gate (e.g., AND gate, 37) has one input from a first CAM cell (e.g., input 35) and an inverted input from an adjacent CAM cell (e.g., input 39). The output from the AND gates 37, 40, 49, 55 are coupled to additional priority encoding logic 59 for further priority encoding. The results from the priority encoder logic 59 is stored in the results register 63.

Values to be compared can be stored in CAM cell word registers in ascending, descending or user-defined order. It should be noted that although CAM cell word data does not have to be stored in a particular order, it can be useful to do so when using a spatial or relationship based priority scheme. A simple gate structure in the priority encoding logic 59 can provide an easily implemented priority encoder assuming an ordered sequence of values are stored in the CAM word registers.

Spatial based priority encoding can be based on the premise that if a input value falls within a known sequence of ordered boundary values, the two boundary values which are on either side of the input value will be the highest priority match value. Spatial priority schemes have increased speed in some cases because it can be determined immediately when a value falls within two closest boundary values stored in the CAM cell words.

Higher level CAM cell node addresses can be set to automatically have a higher priority if a spatial priority encoding scheme is used. Priority encoder designs based on position of the matched CAM cell are similarly simplified.

In the situation where CAM data stored in CAM word registers are not ordered, then a state machine is needed to determine which CAM cell value will be the final or global result. The state machine logic can be incorporated into the priority encoder logic 59.

Referring back to FIG. 1, range boundary values are stored into the CAM cell word registers (e.g., registers 11, 17). Comparison operations determine if a value falls within two range boundary values stored in CAM cell word registers. The CAM cell storing a value higher than the data stored in the comparant register 7 can referred to as an upper range boundary value and the CAM cell storing a value lower than the data stored in the comparant register 7 can be referred to as a lower range boundary value. The AND gates 37, 40, 49, 55 in the priority encoder 61 detect the upper and lower range boundary values from the CAM cells (e.g., cells 9, 15) and output a signal to the priority encoder logic 59.

The priority encoder 59 can also have an input from either the CAM cells or a controller that indicates to the encoder 59 which comparison type will be performed within all or a portion of the CAM cells. One embodiment of the invention stores configuration data in CAM cell words (e.g., words 11, 17, 20, 25, 31) in addition to comparison data to indicate the type of comparison performed by its associated CAM cell comparator. Other arrangements are also possible where the configuration data is stored in other places and input lines into the CAM cells are used to direct the type of comparison that will be accomplished by CAM cell comparators (e.g., comparator 13).

Figure 2:
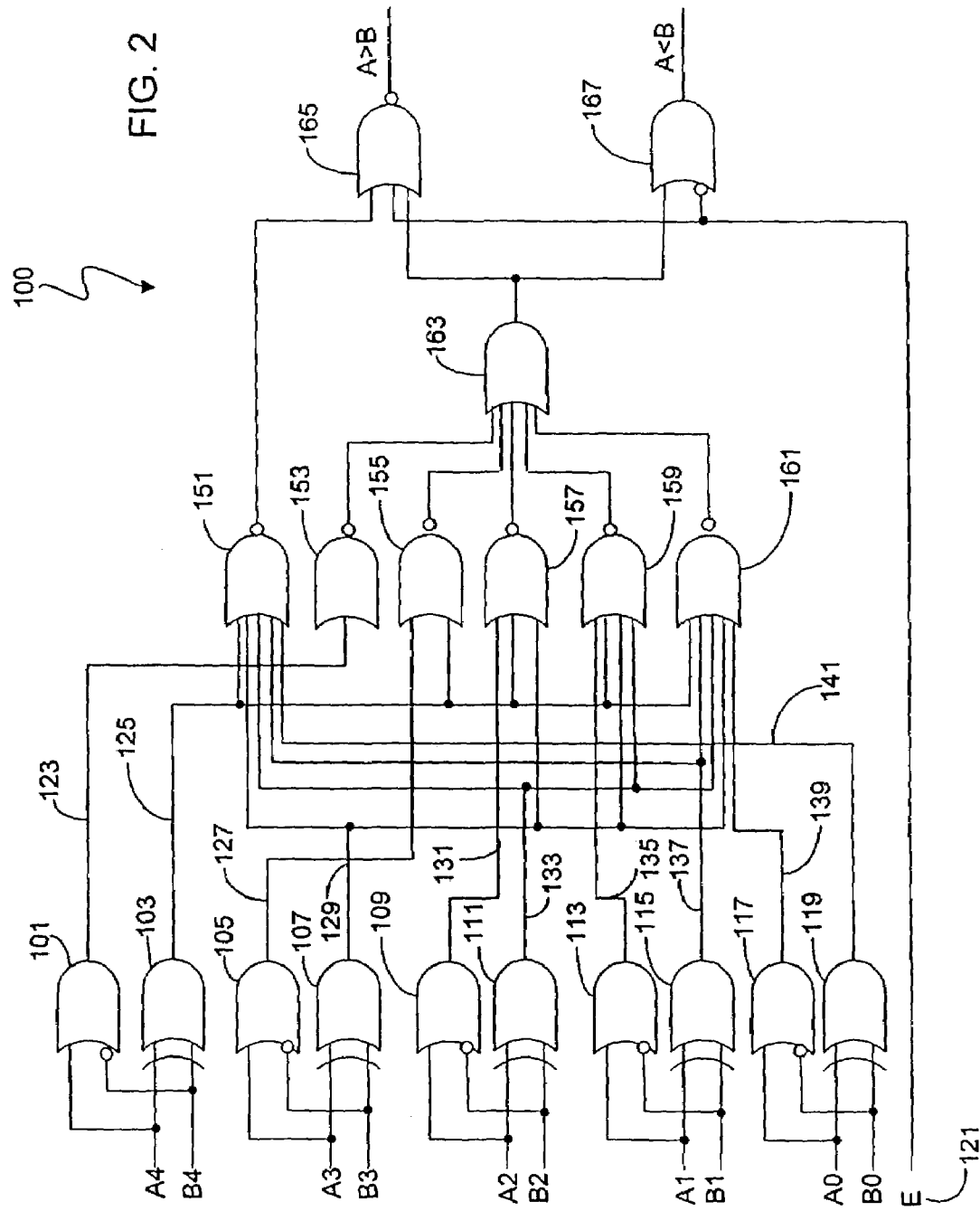
FIG. 2 shows an exemplary comparator used within a CAM cell constructed in accordance with an exemplary embodiment of the invention.

Referring to FIG. 2, an exemplary embodiment of a comparator 100 to be used within an embodiment of a magnitude comparator CAM cell, such as in, e.g., comparators 13, 18, 21, 27, 33 (FIG. 1) in accordance with the invention is shown. A 5-bit comparator 100 is shown to illustrate the invention, but it should be understood that the invention is not limited to a 5-bit comparator or any other specific type of comparator. The comparator 100 has an enable bit line 121, which enables or disables the comparator 100. In many cases, a CAM array contains CAM cells which do not contain data. The enable bit line 121 provides a capability to disable outputs from a comparator that is coupled to CAM cells which do not contain data to reduce processing and/or avoid errors. Comparator 100 may be designed without the enable/disable function if such a function is not desired. CAM comparator inputs A0, A1, A2, A3 and A4 are coupled to the bits in the comparant register 7 (FIG. 1) and inputs B0, B1, B2, B3 and B4 are coupled to a CAM word (e.g., word 11) within the same CAM cell (e.g., cell 9) that the comparator 100 is located (e.g., FIG. 1, comparator 13). Inputs A0 through A4 are compared with inputs B0 through B4 by a series of OR gates (each one with an inverted input) and XOR gates sets (XOR 119, OR 117), (XOR 113, OR 115), (OR 109, XOR 111), (OR 101, XOR 103) which are designed in such a way to detect a greater-than or a less-than condition. Each input pair, e.g., (A0, B0), (A1, B1), (A2, B2), (A3, B3) and (A4, B4) are coupled to first tier (Tier I) sets of two logic gate groups which includes an OR gate with an inverted input on the B input and an XOR gate. Referring to FIG. 2, inputs A0, B0 are connected to OR gate 117 and XOR gate 119. Inputs A1, B1 are coupled to OR gate 113 and XOR gate 115. Inputs A2, B2 are coupled to OR gate 109 and XOR gate 111. Inputs A3, B3 are coupled to OR gate 105 and XOR gate 107. Inputs A4, B4 are coupled to OR gate 101 and XOR gate 103.

Each tier I logic gate 101, 103, 105, 107, 109, 111, 113, 115, 117 and 119 has a single output that is coupled to a second tier (Tier II) group of NOR gates 151, 153, 155, 157, 159, 161 as follows. The output of OR gate 101 is coupled to an input of NOR gate 153 by bit line 123. The output of XOR gate 103 is coupled to an input of NOR gates 151, 155, 157, 159, 161 with bit line 125. An output of OR gate 105 is coupled to an input to NOR gate 155 by bit line 127. An output of XOR gate 107 is coupled to inputs to NOR gates 151, 157, 159, 161 by bit line 129. An output of OR gate 109 is coupled to an input of NOR gate 157 by bit line 131. An output of XOR gate 111 is coupled to inputs of NOR gates 151, 159, 161 by bit line 133. An output from OR gate 113 is coupled to an input of NOR gate 159 by bit line 135. An output from XOR gate 115 is coupled to inputs of NOR gates 161 and 151 by bit line 137. An output from OR gate 117 is coupled to an input of NOR gate 161 by bit line 139. An output from XOR gate 119 is coupled to an input of NOR gate 151 by bit line 141.

A third group (Tier III) of logic gates 163, 165, 167 receives the outputs from the Tier II group of NOR gates 151, 153, 155, 157, 159, 161. OR gate 163 inputs the outputs from NOR gates 153, 155, 157, 159, 161. An input to NOR gate 165 is coupled to an output from NOR gate 151, an output from Tier III OR gate 163 and the enable bit line 121. A true or "1" output from OR gate 165 indicates that the data value stored in the comparant register 7 is greater-than the value stored in a CAM word (e.g., FIG. 1, word 11) that the comparator 100 (e.g., FIG. 1, comparator 13) is coupled to. OR gate 167 is coupled to OR gate 163 and the enable bit line 121. The input from the enable bit line 121 into OR gate 167 is inverted. A true ("1") output from OR gate 167 signifies that the data value stored in the comparant register 7 is less-than the value stored in the CAM word (e.g., FIG. 1, word 11) that the comparator 100 (e.g., FIG. 1, comparator 13) is coupled with.

Figure 3:
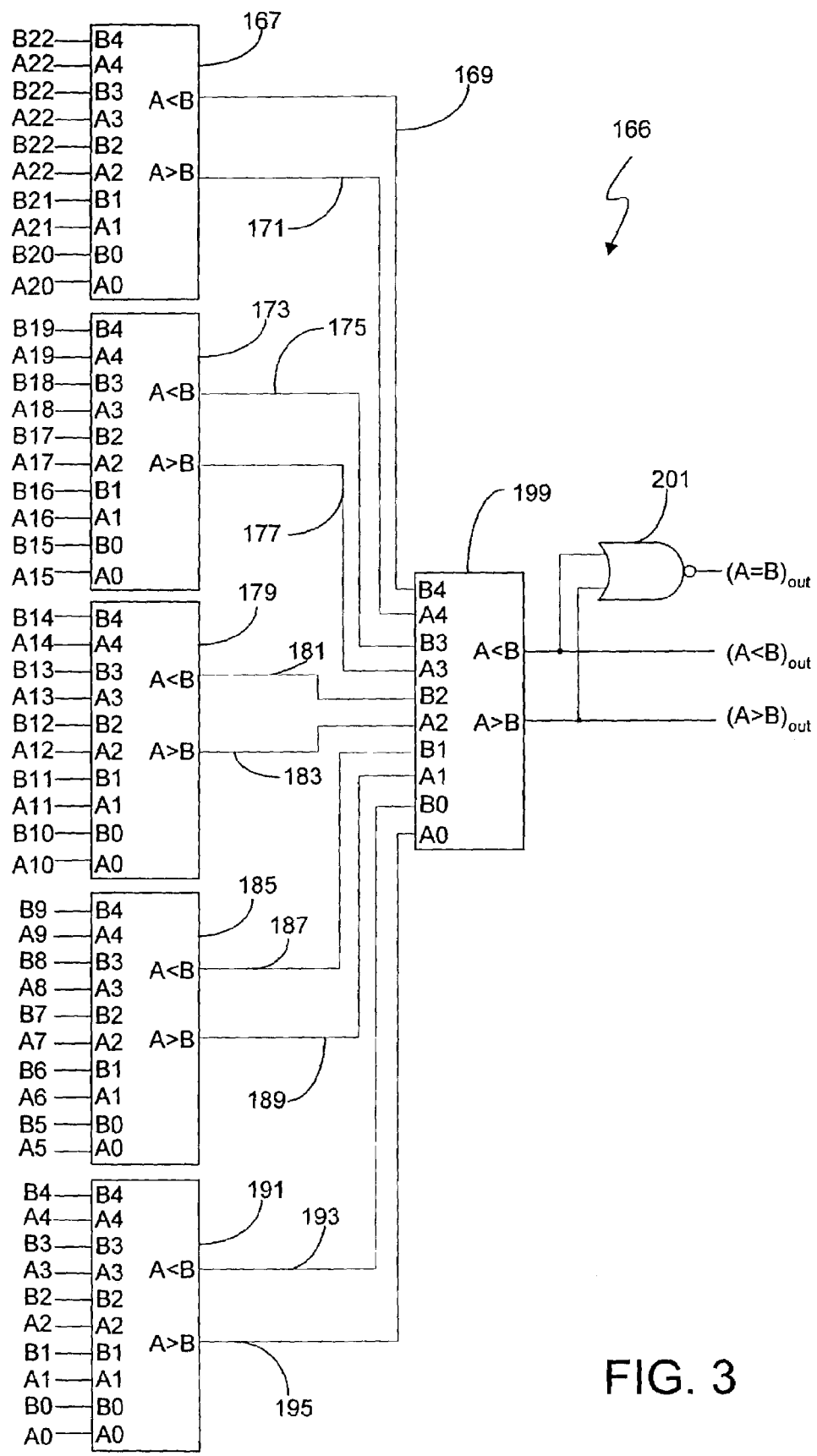
FIG. 3 shows another exemplary comparator used within a CAM cell constructed in accordance with an exemplary embodiment of the invention.

As shown in the exemplary CAM system 1 of FIG. 1, the outputs of the Tier III OR gates 165, 167 can be combined into a single output which is coupled to a priority encoder logic 59 for further priority processing. The two outputs of the Tier III OR gates 165, 167 can also be coupled in a cascaded arrangement of logic encoders as is shown in FIG. 3. It should be noted that a variety of logic configurations can be used to perform the operations of the comparison logic (e.g., comparator 13), such as in shown in the exemplary CAM system of FIG. 1.

Referring to FIG. 3, a cascaded comparator 166 can be used to compare hundreds of masked input key bits input into a CAM cell's word (e.g., FIG. 1, comparator 13) from a comparant register (e.g., FIG. 1, comparant register 7). Inputs A0–A4 and B0–B4 are input into comparator 191. Inputs A5–A9 and B5–B9 are input into comparator 185. Inputs A10–A14 and B10–B14 are input into comparator 179. Inputs A15–A19 and B15–B19 are input into comparator 173. Inputs A20–A22 and B20–B22 are input into comparator 167. Each comparator 219, 223, 227, 231, 235, 239 compares the A inputs from comparant register 7 with the B inputs from a CAM word in the CAM cell (e.g., FIG. 1, cell 9). The two outputs (greater-than, less-than) from each cascaded comparator 167, 175, 179, 185, 191 is input into another five-bit comparator 199 by bit line input pairs (169, 171), (173, 177), (181, 183), (187, 189), (193, 195), respectively. Comparator 199 outputs a greater-than or less-than output signal to a priority encoder (not shown). A NOR gate 201 is coupled to both outputs from comparator 199 to detect an equal-to condition when both outputs from comparator 199 are not-true.

Figure 4:
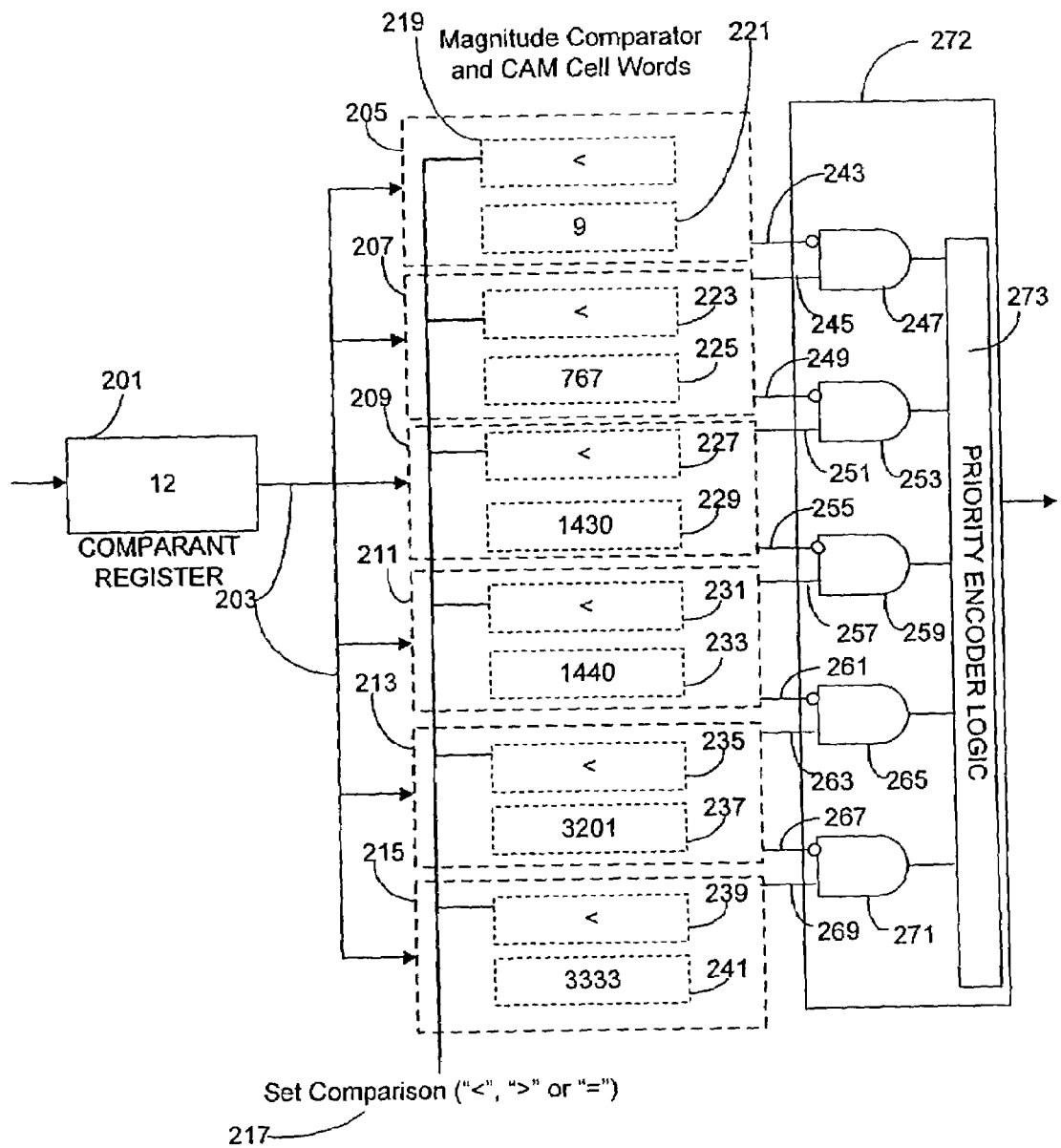
FIG. 4 shows another CAM system with one example of data and comparison operations constructed in accordance with an exemplary embodiment of the invention.

Referring to FIG. 4, another exemplary embodiment of a CAM system in accordance with the invention is shown. The illustrated example contains data values associated with registers and exemplary comparison operations as follows. The CAM system is shown containing a comparant register 201 coupled to a collection of CAM cells 205, 207, 209, 211, 213, 215. The CAM cells each contain a CAM word and a comparator circuit for performing comparison operations. CAM cell 205 contains CAM word 221 and comparator 219. CAM cell 207 contains CAM word 225 and comparator 223. CAM cell 209 contains CAM word 229 and comparator 227. CAM cell 211 contains CAM word 233 and comparator 231. CAM cell 213 contains CAM word 237 and comparator 235. CAM cell 215 contains CAM word 241 and comparator 239.

The comparison operation performed by the comparators, e.g., comparator 239, can be set in a variety of ways. In this exemplary embodiment, a set comparison input line 217 can be used to determine the type of comparison operation (e.g., greater-than, less-than, equal-to) the comparator circuits will perform. The set comparison input 217 is coupled to logic circuitry that permits user designation of comparison operations to be performed. An output from each CAM cell 205, 207, 209, 211, 213, 215 is connected to a priority encoder 272.

The priority encoder 272 contains a set of AND gates 247, 253, 259, 265, 271, each with an inverted input, that receive the outputs from CAM cells 205, 207, 209, 211, 213, 215. The output of CAM cell 205 is coupled to an inverted input of AND gate 247 by bit line 243. The output of CAM cell 207 is coupled to an input of AND gate 247 and an inverted input of AND gate 253 by bit lines 245, 249 respectively. The output of CAM cell 209 is coupled to an input of AND gate 253 and an inverted input of AND gate 259 by bit lines 251, 255 respectively. The output CAM cell 211 is coupled to an input of AND gate 259 and an inverted input of AND gate 265 by bit lines 257, 261 respectively. CAM cell 213 is coupled to an input of AND gate 265 and an inverted input of AND gate 271 by bit lines 263, 267 respectively. CAM cell 215 is coupled to an input of AND gate 271 by bit line 269.

AND gates 247, 253, 259, 265, 271 have one input which is inverted. The same AND gate input (e.g., the first input) is inverted in the same manner for all AND gates or a series of AND gates in an array. It should be understood that the invention is not limited to AND gates physically coupled to adjacent CAM cells. It is possible to create a structure with physically non-adjacent CAM cells but which are logically adjacent using additional logic circuitry within the priority encoder. The output of the AND gates are coupled to priority encoder logic 272 that determines the result with the highest priority which is the most desirable match given user supplied constraints. User supplied constraints in this exemplary embodiment include a CAM word, comparant data and comparison type (e.g., greater-than).

The function of the FIG. 4 CAM system begins with storing an input key into the comparant register 201. The key is then input into a collection of CAM cells 205, 207, 209, 211, 213, 215 and respectively compared with CAM words 221, 225, 229, 233, 237, 241 which contain a user or system defined data value. The CAM cells 205, 207, 209, 211, 213, 215 perform a comparison of CAM words 221, 225, 229, 233, 237, 241 respectively with the input key within the comparant register 201. In this exemplary embodiment, the input key "12" is stored in comparant register 201 and is compared in parallel with the values stored in the CAM words 221, 225, 229, 233, 237, 241. For example, the comparant value of 12 is compared with the value "9" in CAM cell 205. Comparator circuit 221 within CAM cell 205 is set to less-than "<" and the comparison of "12<9" is performed. Since "12" is not less-than "9", a not-true output (i.e., "0") is generated from CAM cell 205. CAM cell 207 contains a CAM word 225 value of "767" and comparator circuit 223 is set to perform a less-than "<" comparison ("12<767") which causes CAM cell 207 to output a true signal (or a "1") to the priority encoder 272. CAM cell 209 contains a CAM word 229 value of "1430" and comparator 227 is set to perform a less-than "<" comparison ("12<1430") which causes CAM cell 209 to output a true signal ("1") to the priority encoder 272. CAM cells 211, 213 and 215 all contain a value stored in their respective CAM words 233, 237 and 241 which are all greater-than the comparant value "12". Accordingly, CAM cells 211, 213 and 215 will each output a true ("1") signal to the priority encoder 272 after comparators 231, 235, 239 perform a comparison of their associated CAM words 233, 237, 241.

Referring to FIG. 5, a truth table with bit line outputs of the CAM cells of FIG. 4 is shown. The illustrated table contains inputs into the AND gates in the priority encoder, including inverted inputs, and results of AND gate operations. The truth table shows that CAM cells 205 and 207 contain CAM word values which are in closest proximity to the comparant value of "12". One of the CAM cells has a no-match, CAM cell 205 ("12<9"=N) and the adjacent CAM cell has found a match ("12<767"=Y). The AND gate 247, which is coupled to both CAM cell 205 and CAM cell 207, receives the inverted input from CAM cell 205 (N inverted to Y)(or "0" inverted to "1") as well as the input from CAM cell 207 ("1"). AND gate 247 outputs a "true" or "1" and thus, the closest boundary values are found to the value ("12") stored in the comparant register 201. The rest of the CAM cells 209, 211, 213, 215 comparisons are evaluated by AND gates 253, 259, 265 and 271. The CAM cells 209, 211, 213 and 215 all output a true to gates 253, 259, 265 and 271 however, the inverted inputs to AND gates 253, 259, 265 and 271 change a series of ("1", "1") outputs from adjacent CAM cells into an AND gate to ("0", "1").

The result of "1" from the priority encoder 272 will cause the memory address of the CAM cell with the content being searched by the CAM system. Memory addresses in this example are memory locations zero to five with CAM cell 205 having address zero and CAM cell 215 having address five. In the IP address example above, once an address has been returned by the CAM system an associated action, which is stored in another location, such as synchronous DRAM (SDRAM), will be executed. For example, a firewall action is stored in SDRAM and will be referenced and accomplished given the memory location of zero.

Boundary values can be designated by a user who inputs appropriate values into the CAM system. In this example, the upper and lower boundary is determined by the relationship between the comparant value and the stored CAM words. In the FIGS. 4 and 5 example, "9" is the closest lower boundary and "767" is the closest upper boundary to the comparant register value of "12" out of multiple boundary values (e.g., "9", "767", "1430", "1440", "3201", "3333"). The upper and lower boundary can change based on user inputs. The closest upper and lower boundary value has the highest priority match. Accordingly, the priority encoder is seeking to find the closest upper and lower boundary for determining the memory address to output to the results register.

Figure 6:
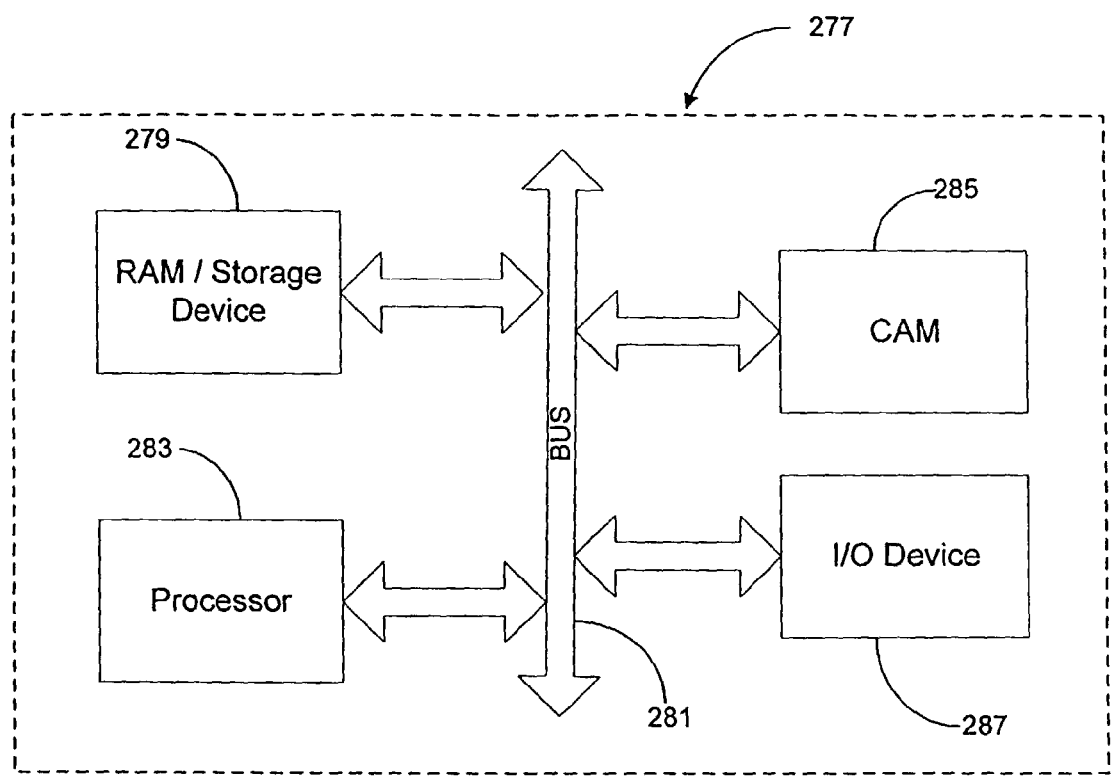
FIG. 6 shows a computer system constructed in accordance with an exemplary embodiment of the invention.

Referring to FIG. 6, a computer system 277 incorporating a CAM system in accordance with on exemplary embodiment of the invention is shown. A RAM/storage device 279, processor 283, CAM device 285 and an input/output device 287 is coupled to a bus 281. One exemplary embodiment can also include Internet traffic routing equipment, image processing systems or other database search system components can be coupled to computer system 277 or incorporated within computer system 277.

Figure 7:
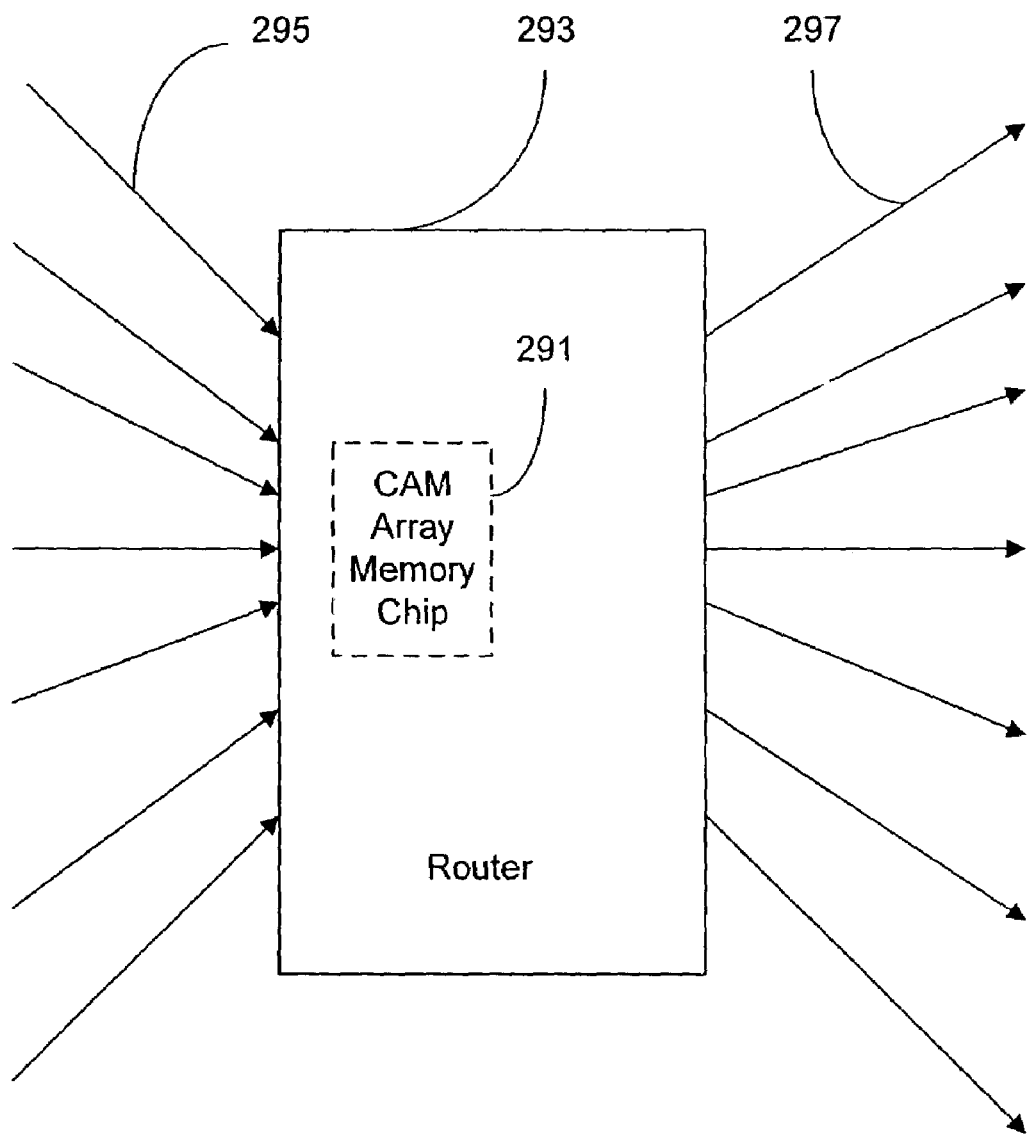
FIG. 7 shows an Internet router with a content addressable memory array constructed in accordance with an exemplary embodiment of the invention.

FIG. 7 is a simplified block diagram of a router 293 as may be used in a communications network such as, e.g., part of the Internet backbone. The router 293 contains a plurality of input lines 295 and a plurality of output lines 297. When data is transmitted from one location to another, it is sent in a form known as a packet. Oftentimes, prior to the packet reaching its final destination, that packet is first received by a router, or some other device. The router 293 decodes that part of the data identifying the ultimate destination of the packet and decides which output line and what forwarding instructions are required for the packet.

Generally, CAMs are very useful in router applications because historical routing information for packets received from a particular source and going to a particular destination is stored in the CAM of the router. As a result, when a packet is received by the router 293, the router already has the forwarding information stored within its CAM 291. Therefore, only that portion of the packet IP address or other payload information that identifies the sender and the recipient need be decoded in order to perform a search of the CAM to identify which output line an instructions are required to pass the packet onto a next node of its journey.

Still referring to FIG. 7, router 293 contains the added benefit of employing a semiconductor memory chip containing a CAM array, such as depicted in FIG. 1 or 4. Therefore, not only does the router benefit from having a CAM but also benefits by having a CAM with the ability to execute instructions based upon one or more ranges of IP addresses of received packets or other packet range data, in accordance with an embodiment of the invention.

Figure 8:
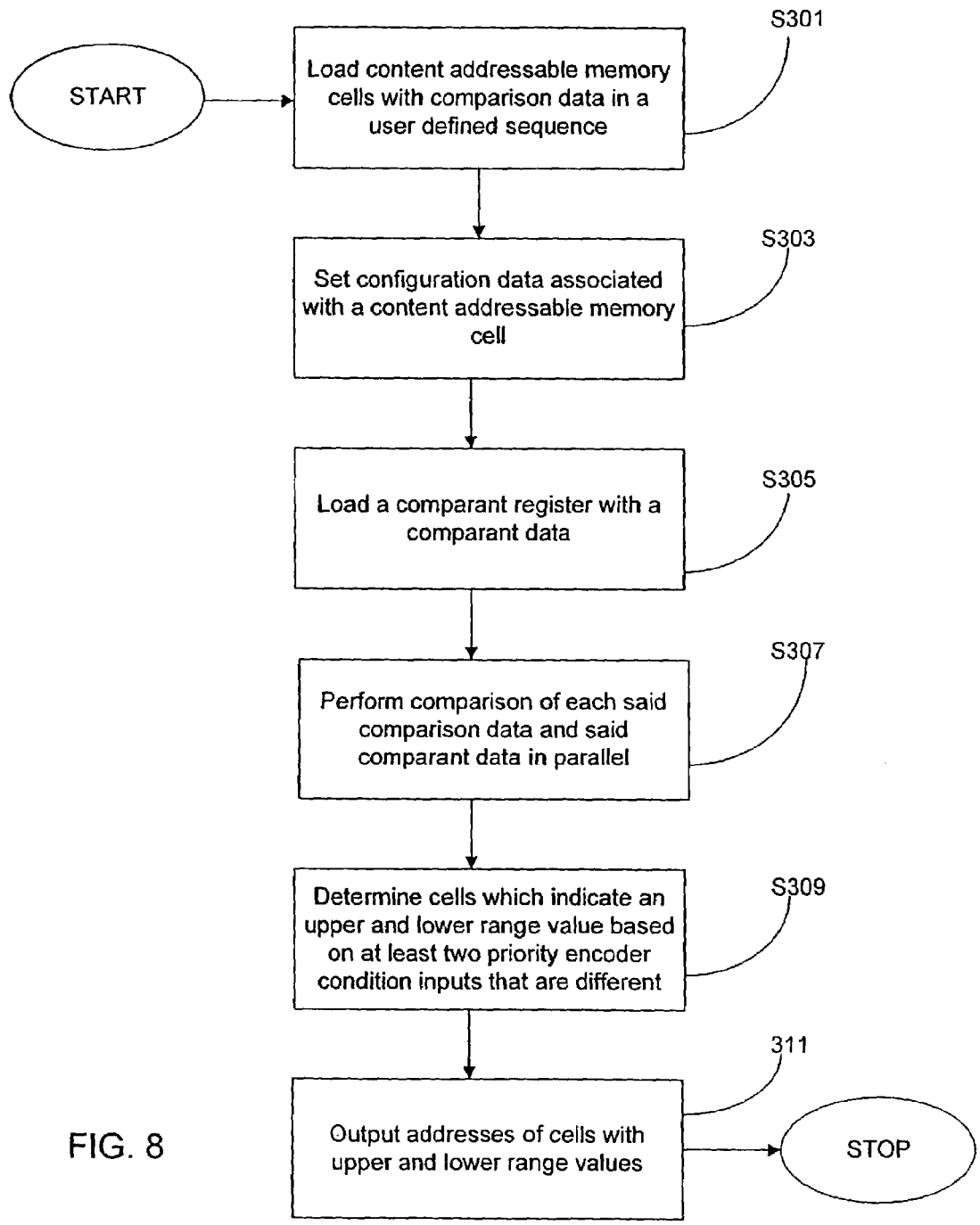
FIG. 8 shows a method of performing content memory addressing in accordance with an exemplary embodiment of the invention.

Referring to FIG. 8, a method of performing content addressable memory processing is shown. At processing segment S301, content addressable memory cells are loaded with comparison data in a user-defined sequence. At processing segment S303, configuration data associated with a content addressable memory cell is set. At processing segment S305, a comparant register with is loaded with comparant data. At processing segment S307, a comparison of each of the comparison data and the comparant data is accomplished in parallel. At processing segment S309, CAM cells storing an upper and lower range value that are numerically closest to the comparant value is determined. The CAM cells storing the upper and lower range values are identified by the priority encoder by determining which two physically or logically related CAM cell outputs have a predetermined relationship, such as which adjacent outputs are different (e.g., "0", "1"). At processing segment S311, addresses of cells with upper and lower range values determined in processing segment S309 are output.

Generally, an upper and lower range value can be determined by determining which CAM cells in a CAM system contain an upper and lower range value based upon a relationship between comparison results from the CAM cells storing a user ordered set of CAM comparison data. The determination of which CAM cells indicate correct range can be done by determining which adjacent CAM cells contain data which is and is not greater-than or less-than the comparant data.

Processing segment S303 can be accomplished by initially setting a desired comparison operation. Comparison operations can also be set by storing an appropriate value in a configuration bit which is part of each CAM cell word. The configuration bit can be the same or different for various CAM cells in a CAM array or CAM system. Processing segment S303 can also be accomplished by automatically loading configuration data associated with a content addressable memory cell as well as retaining a desired comparison operation in non-volatile memory. The user-defined sequence of segment S301 can be defined as a sequence which is from a lower to higher value order. The comparison data can include a representation of one or more comparant data as well. The CAM system can be physically or logically divided into multiple segments with different comparant data. The configuration data can include a comparator condition such as a greater-than, less-than or an equal-to condition operator. The comparator data as well as the CAM word data can be loaded at initialization or it can be updated during system operation.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A content addressable memory comprising:
   a plurality of first structures, each first structure comprising a comparison circuit portion and a data storage portion, said data storage portion storing first and second data; and
   a logic structure receiving at least one output from each of said first structures in parallel, said logic structure comprises a plurality of condition logic, each condition logic determining if a condition is true with respect to one or more output signals from adjacent ones of said first structures.

2. A content addressable memory as in claim 1, wherein said first data is comparison operation configuration data.

3. A content addressable memory as in claim 2, wherein said second data is content addressable memory word data.

4. A content addressable memory as in claim 1, wherein data storage portion further stores third data.

5. A content addressable memory as in claim 4, wherein said third data is a content addressable memory word data mask.

6. A content addressable memory as in claim 1, wherein said comparison circuit portion further comprises a disable comparison portion.

7. A content addressable memory as in claim 1, wherein said first data is user ordered content addressable memory data.

8. A content addressable memory comprising:
   a plurality of comparison structures, said comparison structures comprising a memory storage location for storing comparison data and a comparator for comparing an input data with said comparison data and determining if a selected one of a first, second and third condition is true, said comparator outputting an output signal; and
   a logic structure receiving at least one of said output signals from each of said comparison structures in parallel, said logic structure comprises a plurality of condition logic circuits, said condition logic circuits determining if a fourth condition is true with respect to pairs of said output signals and outputting a range indicator signal associated with each pair that meets said fourth condition.

9. A content addressable memory as in claim 8, wherein said condition logic comprises an AND gate with one input inverted.

10. A content addressable memory as in claim 8, wherein said first, second and third conditions respectively comprise greater-than, less-than and equal-to conditions.

11. A content addressable memory as in claim 8, wherein said memory storage location is a content addressable memory word.

12. A content addressable memory as in claim 8, wherein said input data is a data value received from a comparant register.

13. A content addressable memory as in claim 8, wherein each comparison structure further comprises a memory storage location for storing configuration data for determining which one of said first, second and third condition will be performed.

14. A content addressable memory as in claim 8, wherein said pairs are received from adjacent comparison structures.

15. A content addressable memory as in claim 8, wherein said comparison data comprises one value of a plurality of possible input data values.

16. A content addressable memory as in claim 15, wherein each said pair is associated with comparison structures that are related based on an ordered sequence of comparison structures, which are ordered based upon said comparison data stored in each said comparison structure.

17. A content addressable memory device comprising:
    a plurality of memory cells, each of said memory cells comprising a storage location and comparison logic associated with said storage location, said comparison logic for comparing a first content of said storage location with a second content of an input data storage location and determining if one of first and second conditions is true with respect to said comparison, each of said memory cells respectively outputting an output signal indicative of a result of said determination; and
    a logic structure receiving at least one said output signals from each of said memory cells, said logic structure determining and outputting a range data based upon a relationship between two said output signals respectively from associated said memory cells.

18. A content addressable memory device of claim 17, wherein said first and second conditions respectively comprise a greater-than and less-than condition.

19. A content addressable memory device as in claim 17, further comprising a configuration data storage location for storing control data for controlling which of said conditions will be determined with respect to said comparison of said first and second contents.

20. A content addressable memory device of claim 17, wherein said comparison logic further determines if a third condition is true with respect to said comparison of said first and second contents.

21. A content addressable memory device as in claim 20, wherein said third condition comprises an equal-to condition.

22. A content addressable memory device as in claim 20, further comprising a configuration data location for storing a control data for controlling which said conditions will be determined with respect to said comparison of said first and second contents.

23. A content addressable memory device comprising:
    a plurality of content addressable memory cells, each of said cells comprising a storage location for storing comparison data for comparison with an input data and a comparator for comparing said input data with said comparison data and determining if one of a plurality of conditions are true, said comparator outputting at least one output signal based on said determination; and
    a priority encoder for receiving in parallel at least one output signal from each comparator, said encoder comprising a plurality of condition logic for determining if an encoder condition is true with respect to two or more groups of said output signals received from adjacent cells and outputting a range indicator data associated with each said group which meets said encoder condition.

24. A content addressable memory device as in claim 23, wherein said comparison data comprises one representation of a plurality of possible input data representations.

25. A computer processing system comprising:
    at least one computer bus;
    an input and output system coupled to said at least one computer bus;
    a computer processor coupled to said input output system and to said at least one computer bus;
    at least one memory for storing computer processing representations comprising processing instructions and data coupled to said at least one computer bus; and
    a plurality of content addressable memory cells coupled to said computer bus, said cells comprising:
    a plurality of memory cells, each memory cell comprising a comparison circuit portion and a data storage portion, said data storage portion storing a first and second data; and
    a logic structure receiving at least one output signal from each memory cell in parallel, said logic structure comprises a plurality of condition logic, each condition logic determining if a condition is true with respect to one or more output signals from adjacent ones of said memory cells.

26. A computer processing system as in claim 25, wherein said first data is an comparison operation configuration data.

27. A computer processing system as in claim 26, wherein said second data is content addressable memory word data.

28. A computer processing system as in claim 25, wherein data storage portion further stored a third data.

29. A computer processing system as in claim 28, wherein said third data is content addressable memory word data mask.

30. A computer processing system as in claim 25, wherein said data storage portion further comprises a disable comparison data.

31. A computer processing system as in claim 25, wherein said first data is a user ordered content addressable memory data.

32. A computer system comprising:
    at least one computer bus;
    an input and output system coupled to said at least one computer bus;
    a computer processor coupled to said input output system and to said at least one computer bus;
    at least one memory for storing computer processing representations comprising processing instructions and data coupled to said at least one computer bus; and
    a plurality of content addressable memory cells coupled to said computer bus, said cells comprising:
    a plurality of comparison structures, said comparison structures comprising a memory storage location for storing a comparison data and a comparator for comparing an input data with said comparison data and determining if a selected one of a first or second condition is true, said comparator outputting an output signal; and
    a logic structure receiving at least one said output signal from each said comparison structures in parallel, said logic structure comprises a plurality of condition logic, said condition logic determining if a third condition is true with respect to pairs of said output signals and outputting a range indicator signal associated with each pair that meets said third condition.

33. A computer system as in claim 32, wherein said comparator further determines if a fourth condition is true, said comparator outputting an output signal to said logic structure.

34. A computer system as in claim 33, wherein said fourth condition comprise an equal-to condition.

35. A computer system as in claim 32, wherein said first and second condition respectively comprise greater-than and less-than conditions.

36. A computer system as in claim 32, wherein said memory storage location is a content addressable memory word.

37. A computer system as in claim 32, wherein each comparison structure further comprises a memory storage location for storing a configuration data for determining which one of said first and second condition will be performed.

38. A computer system as in claim 32, wherein said pairs of outputs are received from adjacent said comparison structures.

39. A processing system comprising:
    a storage location for storing a comparison data, a comparator associated with each said storage location for comparing an input data from a comparant register and said comparison data and a priority encoder receiving an output from each said comparator in parallel, said comparator comparing said comparison data with said input data and generating an output based upon a selected one of a first plurality of conditions comprising greater-than, less-than or optionally equal-to conditions, said priority encoder determining a range based upon said first plurality of conditions and a second condition, said second condition is based upon relationships between said comparators which each contain a different comparison data, said comparison data comprising a representation of an input data selected from a plurality of possible input data representations.

40. A router, comprising:
    a plurality of message receiving inputs;
    a plurality of message transmitting outputs; and
    a content addressable memory (CAM) device, said device comprising:
    a plurality of first structures, each first structure comprising a comparison circuit portion and a data storage portion, said data storage portion storing first and second data; and
    a logic structure receiving at least one output from each of said first structures in parallel, said logic structure comprises a plurality of condition logic, each condition logic determining if a condition is true with respect to one or more output signals from adjacent ones of said first structures.

41. A router as in claim 40, wherein said first data is comparison operation configuration data.

42. A router as in claim 41, wherein said second data is content addressable memory word data.

43. A router as in claim 40, wherein data storage portion further stores third data.

44. A router as in claim 43, wherein said third data is a content addressable memory word data mask.

45. A router as in claim 40, wherein said comparison circuit portion further comprises a disable comparison portion.

46. A router as in claim 40, wherein said first data is content addressable memory data stored sequentially in CAM memory words in an ascending sequence.

47. A router as in claim 40 further comprising a firewall system adapted to filter said route messages.

48. A method of performing content addressing comprising:
- loading a plurality of content addressable memory (CAM) cells with comparison data in a user-defined sequence;
- loading a comparant register with comparant data;
- performing comparison of each said comparison data and said comparant data in parallel based on a comparison operation; and
- determining a first CAM cell that indicates a first range boundary and a second CAM cell that indicates a second range boundary based upon a first and second output from at least two said CAM cells.

49. A method as in claim 48, further comprising setting configuration data associated with said plurality of CAM cells.

50. A method as in claim 49, wherein said configuration data comprises said comparison operation.

51. A method as in claim 50, further comprising changing said configuration data from a first configuration data to a second configuration data for each said CAM cell.

52. A method as in claim 51, wherein the step of setting configuration data associated with said plurality of CAM cells comprises initially setting said comparison operation for each said plurality of CAM cells.

53. A method as in claim 50, wherein said configuration data comprises a comparison operation including greater-than and equal-than.

54. A method as in claim 50, wherein the step of setting configuration data associated with a plurality of CAM cells comprises retaining a previously set said comparison operation.

55. A method as in claim 50, wherein said configuration data comprises a comparison operation selected from the group comprising greater-than and less-than.

56. A method as in claim 55, wherein said group further comprises an equal-to comparison operation.

57. A method as in claim 48, further comprising outputting an address for said first and second CAM cells.

58. A method as in claim 48, wherein said user-defined sequence is from a lower to higher value order.

59. A method as in claim 48, wherein said comparison data comprises a representation of one of a range of Internet Protocol address data.

60. A method as in claim 48, wherein said first and second CAM cell outputs are true and false outputs respectively from two physically adjacent CAM cells.

* * * * *

UNITED STATES PATENT AND TRADEMARK OFFICE
CERTIFICATE OF CORRECTION

PATENT NO. : 6,987,683 B2
APPLICATION NO. : 10/440131
DATED : January 17, 2006
INVENTOR(S) : Hai Ao It is certified that error appears in the above-identified patent and that said Letters Patent is hereby corrected as shown below:

Column 2, line 6, "or" should read --nor--;

Column 4, line 38, "contain" should read --contains--;

Column 6, line 36, "that" should read --where--;

Column 8, line 10, "receive" should read --receives--; and

Column 10, line 12, "an" should read --and--.

Claim 17, column 12, line 26, "one said" should read --one of said--;

Claim 26, column 13, line 27, "an comparison" should read --a comparison--;

Claim 34, column 14, line 6, "comprise" should read --comprises--;

Claim 35, column 14, line 8, "condition" should read --conditions--; and

Claim 37, column 14, line 16, "condition" should read --conditions--.

Signed and Sealed this

Tenth Day of October, 2006

JON W. DUDAS
*Director of the United States Patent and Trademark Office*